United States Patent
Rosenbaum et al.

(10) Patent No.: US 8,460,752 B2
(45) Date of Patent: Jun. 11, 2013

(54) HIGH-THROUGHPUT CVD SYSTEM

(75) Inventors: Leonard Rosenbaum, Greenport, NY (US); Karlheinz Strobl, Mount Sinai, NY (US); Paul J. Decker, Ridge, NY (US)

(73) Assignee: CVD Equipment Corporation, Ronkonkoma, NY (US)

( * ) Notice: Subject to any disclaimer, the term of this patent is extended or adjusted under 35 U.S.C. 154(b) by 900 days.

(21) Appl. No.: 12/559,961

(22) Filed: Sep. 15, 2009

(65) Prior Publication Data

US 2010/0068384 A1   Mar. 18, 2010

Related U.S. Application Data

(60) Provisional application No. 61/097,005, filed on Sep. 15, 2008.

(51) Int. Cl.
*C23C 16/00* (2006.01)

(52) U.S. Cl.
USPC ................. 427/255.28; 427/100; 427/569

(58) Field of Classification Search
USPC ................................ 427/255.28, 100, 569
See application file for complete search history.

(56) References Cited

U.S. PATENT DOCUMENTS 6,480,074 B1 * 11/2002 Kaitila et al. ............ 333/188
7,432,201 B2 * 10/2008 Takehara et al. ......... 438/685

* cited by examiner

*Primary Examiner* — Jie Yang
(74) *Attorney, Agent, or Firm* — Hoffmann & Baron, LLP

(57) ABSTRACT

The use of deposition modules groups for each CVD deposition position including at least two deposition modules, together with a Motion Control System that controls and confines the motion of said deposition modules, enables a quick deposition module exchange at the deposition locations of On-Line or Off-Line CVD coating system. This results in a high volume large area CVD coating system that can increase the commercial viability of a given CVD system design through production throughput increases, production cost reductions, overall higher process flexibility and/or improved film quality.

9 Claims, 8 Drawing Sheets

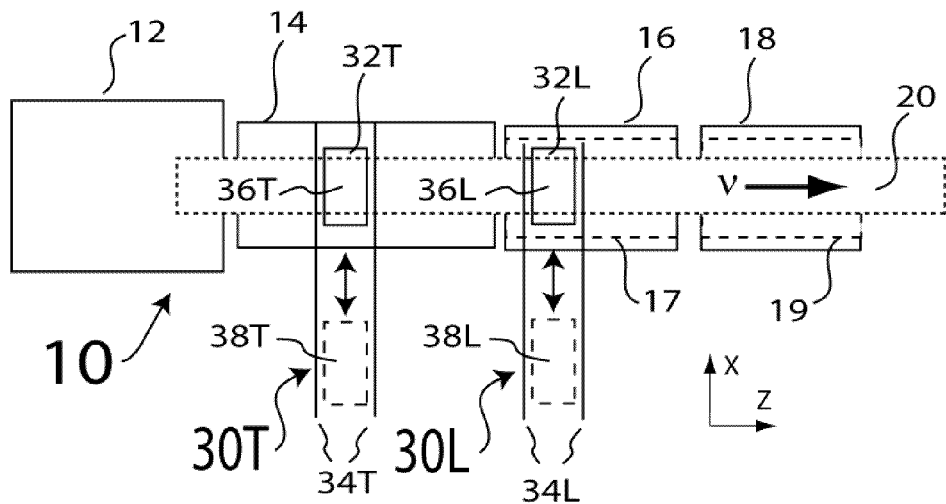
Figure: 1
PRIOR ART
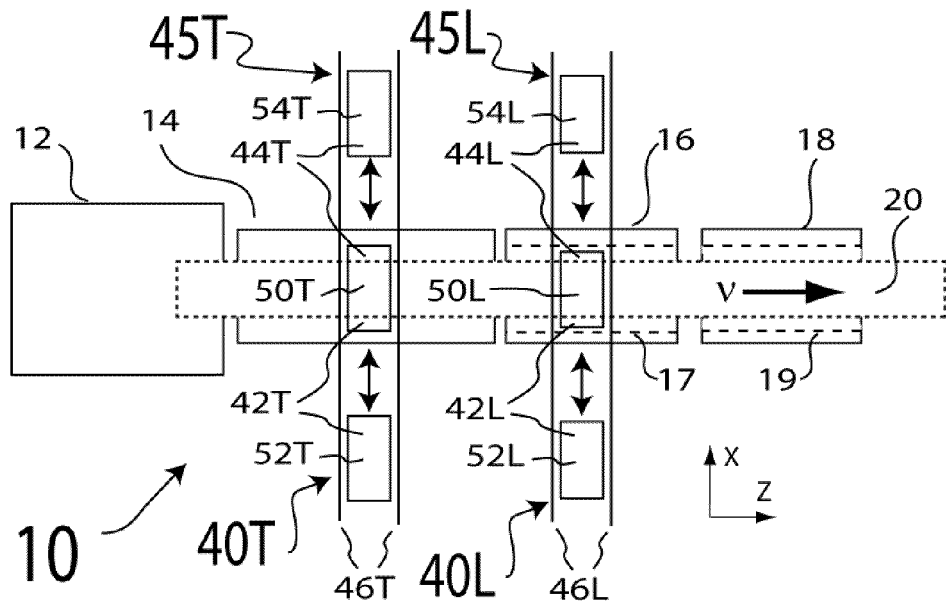
Figure: 2a

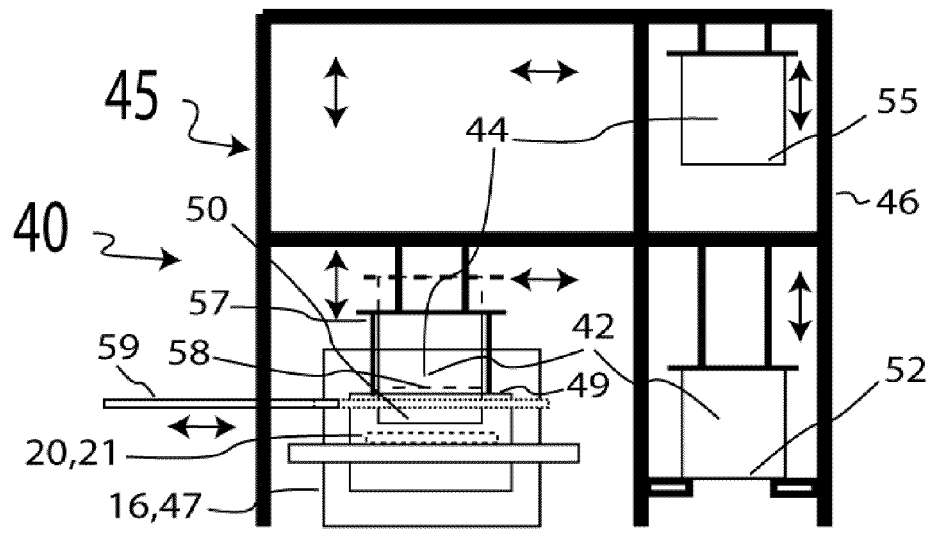
Figure: 2b
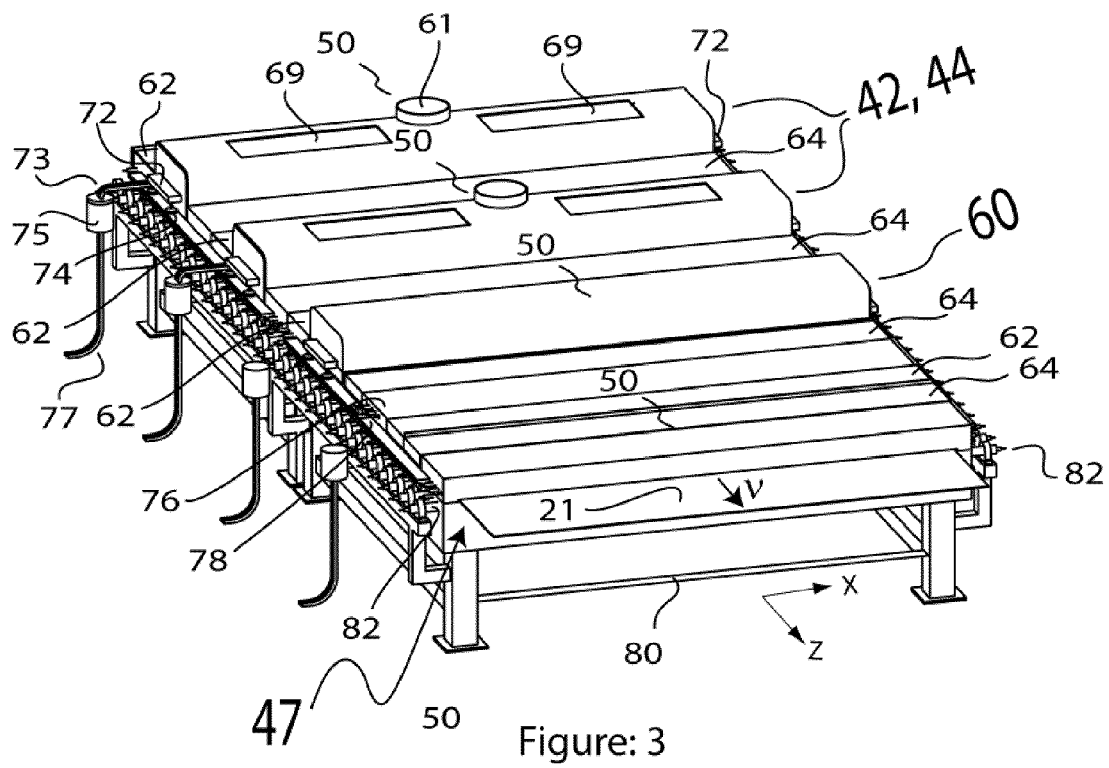
Figure: 3

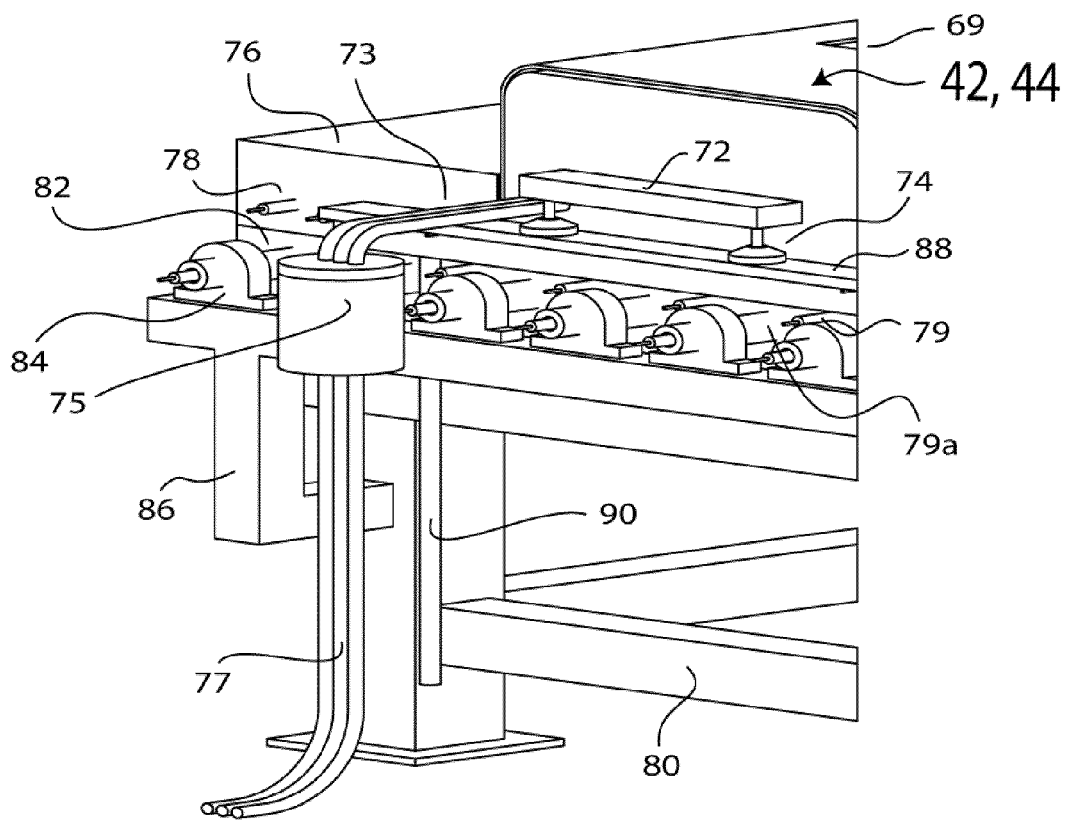
Figure: 4

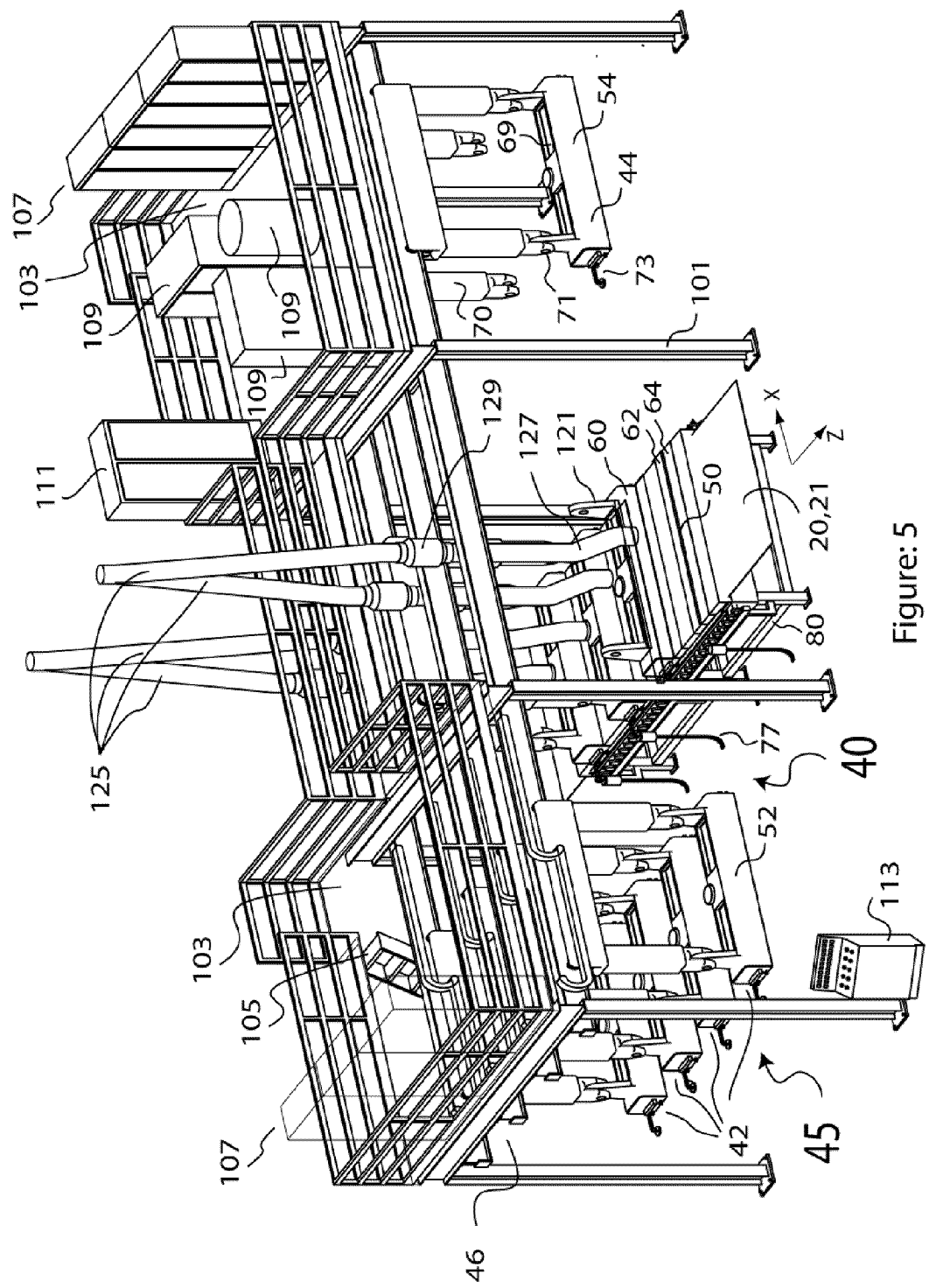
Figure: 5

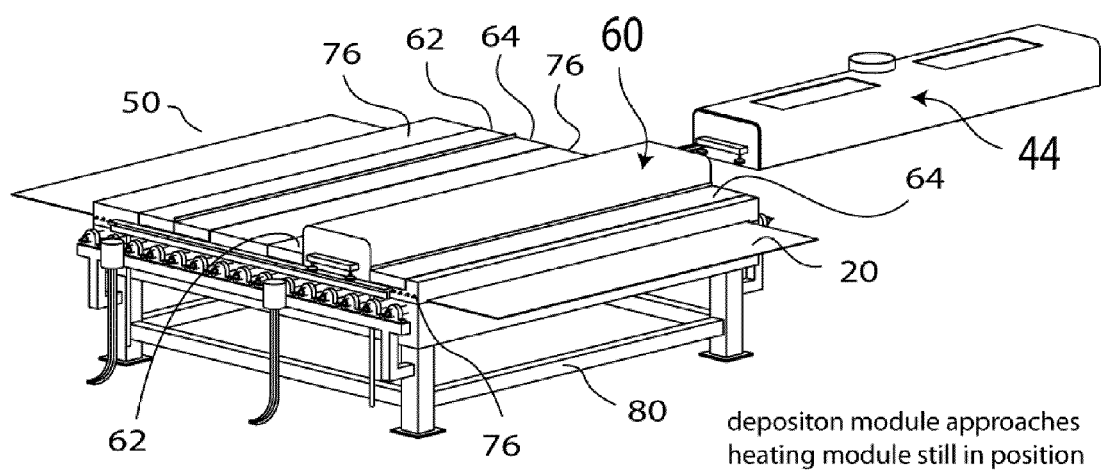
Figure: 6a

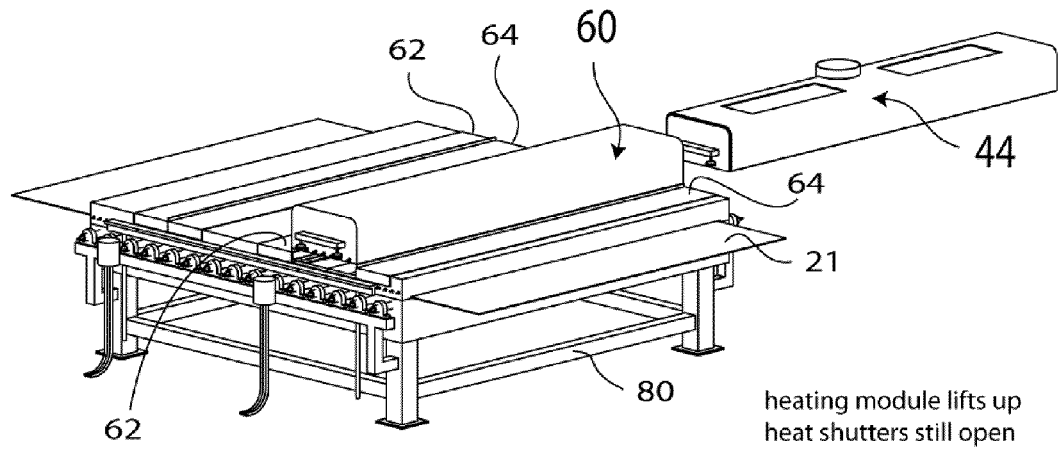
heating module lifts up
heat shutters still open
Figure: 6b
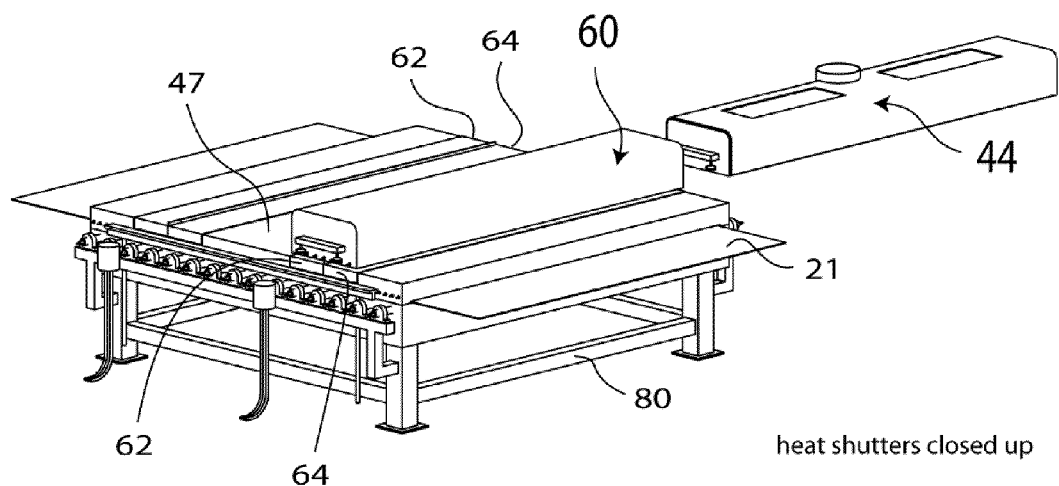
heat shutters closed up
Figure: 6c

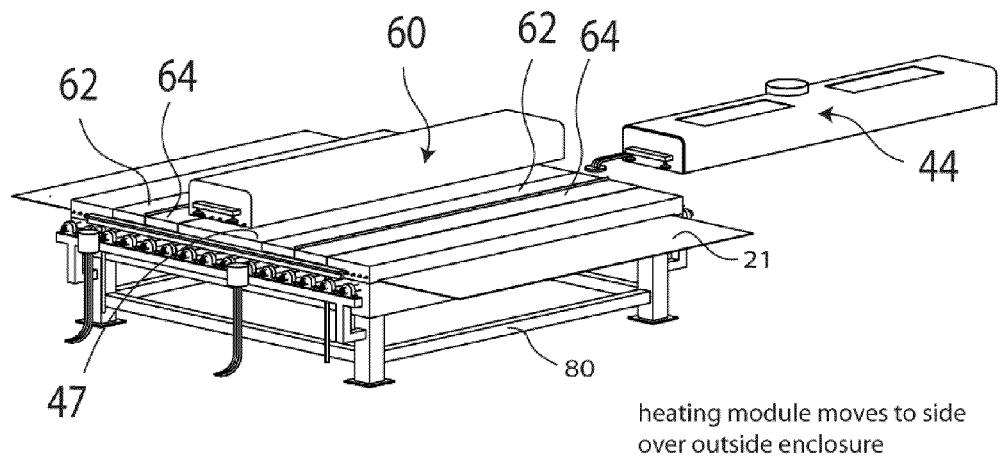
heating module moves to side over outside enclosure
Figure: 6d
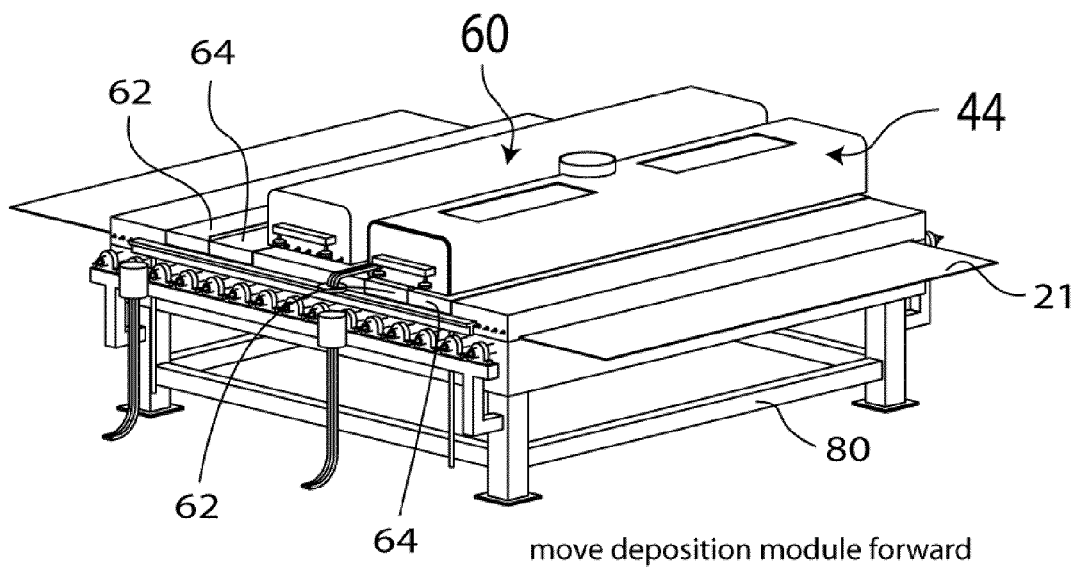
move deposition module forward
Figure: 6e

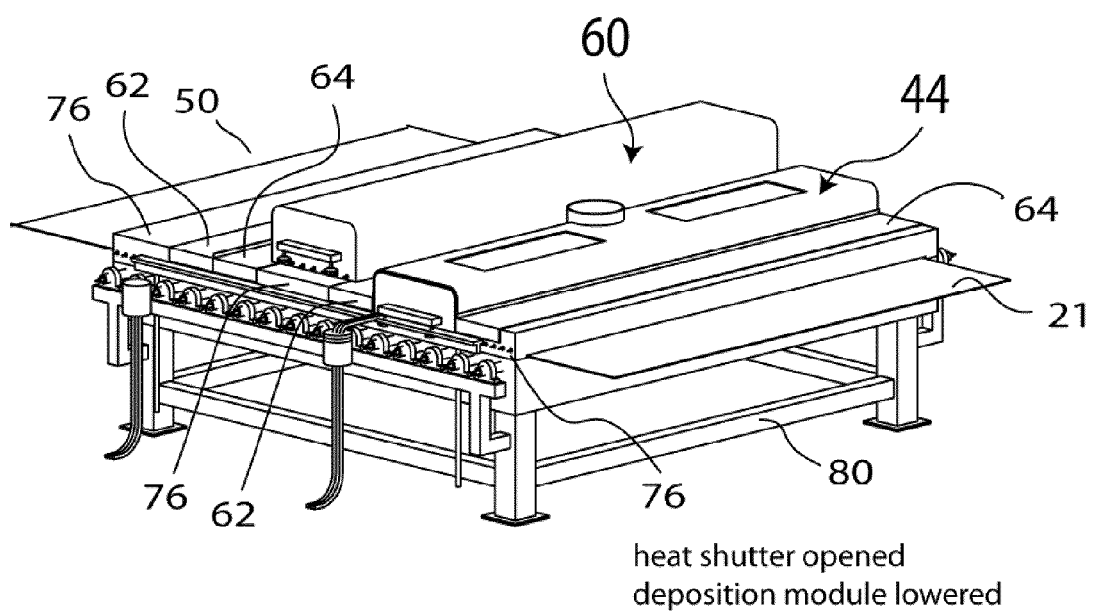
Figure: 6f

US 8,460,752 B2

HIGH-THROUGHPUT CVD SYSTEM

This application claims the benefit of U.S. Provisional Application Ser. No. 61/097,005 filed on Sep. 15, 2008, the disclosure of which is hereby incorporated by reference in its entirety.

FIELD OF THE INVENTION

This invention generally relates to chemical vapor deposition (CVD) systems in general and for high surface quantity substrate coating systems in particular.

BACKGROUND OF THE INVENTION

Atmospheric Pressure Chemical Vapor Deposition (APCVD) systems can be used to deposit, either On-Line, i.e. incorporated in a float glass line, or Off-Line, i.e., separate from a float glass line, one or more thin film layers of metal, metal oxide, metal nitrate and other materials at high deposition rates and at line speed v ranging typically from 0.1 m/min to up to 30 m/min onto large area glass substrates. In such APCVD thin film deposition systems, one or more deposition modules are arranged in a serial manner to deposit a given total thickness for each targeted thin film at a chosen line speed. Such APCVD systems can be used to deposit multilayer films to produce Low-E glass used in the manufacturing of energy efficient (high reflection efficiently of infrared energy) windows, and/or for Transparent Conductive Oxide (TCO) coated glass sheets used for example as substrates for thin film photovoltaic and for display applications. One example of such an On-Line APCVD system can be found in U.S. Pat. No. 6,103,015 and an example of such an Off-Line APCVD system can be found in U.S. Pat. No. 4,595,634.

Other prior art Chemical Vapor Deposition (CVD) systems exist as well that operate either at Atmospheric Pressure (APCVD) or at Low (reduced) Pressures (LPCVD) and may or may not incorporate a continuously operated substrate transport mechanism to deposit at least one CVD thin film onto a wide range of thermally stable substrates. Examples of such thermally stable substrates are Si wafers, flat and bowed glass sheets, partially assembled thin film photovoltaic substrates, display substrates, metal, ceramic and plastic sheets or foils, graphite, carbon-carbon or ceramic tiles, etc. In related LPCVD systems the respective deposition modules are often also called shower heads or injector assemblies and all these names are intended to be used interchangeably in this patent.

During operation, the CVD deposition modules become sufficiently dirty as a result of CVD deposition process as to significantly affect the yield (pinholes and/or coating thickness uniformity) of the coated substrates. Thus, when a given defect threshold is exceeded, the CVD deposition process needs to be stopped because the system is no longer operating in a commercial viable mode. The respective CVD deposition modules must then undergo regular maintenance, i.e. they have to be moved offline, be cleaned, put back into their respective deposition position and reconnected to the process gas supply lines before the CVD deposition process can be resumed.

As a result of this regular deposition module maintenance time, the effective uptime, for example, of prior art On-Line APCVD systems are typically as low as 30-60% for optimum commercial viable system operations. Thus, the available system uptime due to regular deposition module maintenance directly affects the average cost per coated surface area. Further improvements that can minimize the CVD systems down time are therefore desirable.

In some prior art system, this deposition module maintenance frequency issue has sometimes been addressed by adding at least one additional process gas (for example a hydrocarbon gas to act a radical scavenger) to the process chemical mixture needed to achieve a target thin film thickness with a given CVD deposition process that reduces the reaction rate of the chosen process chemistry and allows the deposition process to be spatially more spread out and more uniform in the substrate movement direction. For example, U.S. Pat. No. 5,798,142 describes the influence of $C_2H_4$ on the deposition rate reduction of $SiO_2$ for an APCVD method utilizing $SiH_4$, $O_2$ and $N_2$ as primary APCVD process chemicals. While such prior art compensation methods can increase the deposition module maintenance interval, these methods typically also result in lower average deposition rates, lower process chemical utilization rates and/or limit which process chemistry can be used and/or which multi layer thin film design can produced on a given CVD deposition system. It can also require special (for example with longer deposition length) designed and manufactured CVD deposition modules to compensate for the lower and spatially more extended deposition area.

Two prior art APCVD deposition systems 30 used for On-Line APCVD deposition of thin films on float glass lines are summarized in FIG. 1. A float glass line 10 comprises a melting furnace 12, a tin bath 14, a high temperature annealing lehr 16 with an inside wall 17 and a low temperature annealing lehr 18 with an inside wall 19. Raw material enters the melting furnace 12 and a continuous sheet of float glass 20 exits the low temperature annealing lehr 18 of the float glass line 10 which is subsequently cut to required sizes and stored offline for later usages. To change the thickness of the glass sheet 20, among others, the line speed v of the float glass line 10 need to be adjusted: for example, 2× thinner glass sheet 20 manufacturing requires approximately a 2× faster line speed v and/or a mass throughput change to the melting furnace 12.

Numbers with a letter "T" or "L" attached indicate that the respective component of the APCVD system is from an APCVD system having an On-Line Deposition Position (deposition position) inside the tin bath 14 section ("T") or in the high temperature annealing lehr 16 section ("L") of the float glass line 10. Numbers without a letter attached represent a generic component with no significant distinction of where the respective component is located on a float glass line 10 and/or include equivalent Off-Line CVD systems. The deposition module 32 moves on a motion control system, for example shown in FIG. 1 as a Rail System (rail system) 34 oriented in the X-axis direction, i.e. perpendicular to Z-axis of the float glass line 10, also defined as the direction in which the glass sheet 20 or a respective flat substrate or substrate group moves. The prior art rail system 34 has two principal stop locations: one is at the inline deposition position 36, i.e. over the middle of float glass line, and the other is at the offline maintenance position 38 located on one side (right side shown in FIG. 1) of the float glass line 10 where the deposition module 32 is first fully cooled down and then cleaned, serviced and/or maintained.

For prior art Off-Line CVD systems (not shown in FIG. 1), the deposition module is moved offline, i.e. to the left or right of the Off-Line system's Z-axis and reinserted from the same side after having been cleaning. Typically, mechanical registration means are used to deliver a respective deposition module 32 back to the deposition position 36.

Eventually each deposition module of a CVD coating system needs to be serviced to prevent yield problems due to excess particulates falling from more and more polluted sections of the deposition module onto the substrate or substrates underneath. With the prior art solutions the CVD system design and operation balance requirements (to obtain commercial viability) between system cost, maintenance cost, chemical utilization cost, available space on a given process line, etc. limit the lowest achievable cost for a given high volume (high surface area) CVD system.

Thus, there is a need in the art for a solution which allows for increased process uptime and overall cost reduction per coated substrate surface area in high volume production.

SUMMARY OF THE INVENTION

Therefore, it is a first objective of this invention to enable a CVD system with a higher overall uptime.

It is a second objective of this invention to enable a CVD system having a lower average coating cost per coated surface area.

It is a third objective of this invention to enable a CVD system with a lower down time due to deposition modules servicing needs.

It is a forth objective of this invention to enable a CVD system with a higher coating quality performance option.

It is a fifth objective of this invention to enable a quick changeover of a CVD system from one thin film coating type to another.

It is a sixth objective of this invention to simplify the switching back and forth between a normal float glass line and an APCVD coating system on float glass line operation.

It is a seventh objective of this invention to minimize the risk of breaking the float glass sheet during the removal and/or reinsertion a deposition module.

Several preferred embodiments of the present invention enable in general the design and manufacturing of CVD systems with an improved process window, production cost and/or system performance for high volume thin film depositions on a wide variety of temperature compatible substrates and in particular for thin film glass surface coaters. The longer the deposition length and/or the massive a given deposition module is, for a given CVD system, the more commercially beneficial the improvements of the present inventions are. Note that while most of the preferred embodiments of this invention described below are discussed primarily for high throughput On-Line APCVD systems applications, they can easily be adapted, by those skilled in the art, to Off-Line CVD systems for glass and other flat and temperature compatible substrates as well as for other CVD coating systems where at least one substrate advances in a continuous (inline coater) or in a step wise, semi-continuous manner (batch type) and for both CVD system configurations where the substrate entrance and exit locations are either identical or not identical.

This invention can be incorporated in combination with many prior art deposition module designs and CVD process chemistry option and is not limited to any particular deposition module design, CVD process chemistry or CVD operation mode.

One of the key elements of this invention is the recognition that instead of using a single deposition module for each deposition position, the use of a n-element deposition module group with n≧2 for each deposition position of a given CVD system is typically commercially preferable for high volume CVD deposition onto large area flat substrates. During the CVD thin film deposition process each first deposition module of each such deposition module group is located in a respective deposition position and each other deposition module of each such deposition module group is located in an offline standby position or transitioning between two such standby positions, and with at least one such standby position is being empty, i.e. not containing a deposition module of the respective deposition module group and with the numbers of standby position m≧n.

Another key element of this invention is that the motion of all deposition modules forming such a deposition module group is both controlled and constrained through a motion control system, that enables a deposition module exchange process for the deposition position location, which, for the purpose of this invention, is defined as a suitable fast removal of said first deposition module from each deposition module group from its deposition position and its relocation to said at least one empty standby position and a subsequent relocation of one of said other deposition modules of said deposition module group from its offline standby position and its reinsertion to the deposition position, thus creating a new empty standby position.

The preferred motion control system can be manually and/or motor powered, can be manually and/or automatically controlled, can utilize rails, lead screws, pistons, hinges, chains, gear reducers and/or other motion confining and transferring mechanism and it can include a mechanical self aligning guide, a mechanical stop, a limit switch and/or a position feedback sensors. In one preferred embodiment of this invention both a motorized and/or manual power and a manual and automatic controlled rail system is used. The manual powered motion system is a backup system in case of a motor failure to minimize the risk of substrate breakages during such an unscheduled interrupted deposition module exchange operation.

With the present invention, an uptime for the CVD system of 85-95% is achievable for both On-Line and Off-Line CVD system, as well as for the other above outlined inline and batch type CVD deposition systems. In particular, this is accomplishable even for relative short deposition module maintenance cycles, for example of only 8 hours off uninterrupted deposition time between routine maintenance as long as the total deposition modules pair exchange time is shorter than 1 hour, i.e. 8/(8+1)=88%. This is very achievable with process automation even for deposition modules located in the tin bath 14. Typically, with this invention, a deposition module exchange time of less than a ½ hour can be achieved with optimized automation controls for deposition modules located in the higher temperature lehr 14 section. To minimize the thermal cycling damage to all components and to prevent breakage of the glass sheet 20 proper care has to be taken to minimize rapid thermal shocks during the removal and insertion of the respective deposition modules, with the combination of these constraints limiting in the end how fast the deposition module in the deposition position can be practically be exchanged without causing lifetime or substrate stability issues.

Because the present invention significantly reduces the CVD deposition process restart time, the CVD process uptime is now to a much lesser degree controlled by process chemistry selection, process parameter selections, the design of a particular CVD deposition module, and/or by its location on a CVD processing line. Accordingly, the present invention a much wider, commercially viable, process operation window for a given CVD coating system, which now enables the economical usage of a broader coating type selection, line speed selection, coating material selection, etc. for a CVD system of this invention. Further, the present invention extends the typical usable operational lifetime of a given CVD system, and increases it upgrade capability potential since it can economically accommodate a wider selection of future process chemistry and process parameter updates. It also allows more flexibility to economically manufacture a wider range of large area coating on a wide variety of temperature compatible substrates.

In another preferred embodiment of this invention, a deposition module located in at least one preferred standby position can easily be exchanged, while in said at least one standby positions, with a heat shield that incorporates insulation material and/or an active heating system. Upon using the motion control system to place such a heat shield in the respective deposition position, it allows to substantially convert an APCVD On-Line system back to a normal float glass line system, thereby enabling a fast conversion from one operation mode to the another and possible therefore a more cost efficient, and/or safer process operation for each of such respective system operational modes.

BRIEF DESCRIPTION OF THE DRAWINGS

In order for this invention to be clearly understood and readily practiced, this invention shall be described in conjunction with the drawings set forth herein below with like parts or functions having like numbers.

FIG. 1 shows two prior art APCVD On-Line systems for a float glass line;

FIG. 2a shows two APCVD On-Line systems of this invention for a float glass line with two standby positions opposite of the float glass line.

FIG. 2b shows a CVD system of this invention with two standby positions on the same side of the substrate.

FIG. 3 shows a partial section of an APCVD system of this invention.

FIG. 4 shows a cut-away view of part of an APCVD system of this invention.

FIG. 5 shows a perspective view of an APCVD system of this invention.

FIGS. 6a-6f shows the exchange of a heat shield with a deposition module of this invention for an APCVD system.

DETAILED DESCRIPTION OF THE INVENTION

FIG. 2a shows two preferred APCVD deposition systems 40 of this invention on a float glass line 10. The preferred APCVD deposition systems 40 comprise at least one deposition module group (n=2) formed by two deposition modules 42 and 44 forming a pair, with each of these deposition modules 42 and 44 moving on a motion control system 45 represented by a rail system 46 in FIG. 2a. In one preferred embodiment of this invention, the On-Line APCVD system 40 is located in the high temperature annealing lehr 16 section of the float glass line 10 and it optionally includes additional heating sources located underneath and/or above the glass sheet 20 to elevate the temperature of the moving glass sheet 20 to a respective substrate process target temperature before it enters underneath the next deposition module at the next deposition position 50 or while it passed through the deposition position 50 underneath a deposition module to obtain the targeted film thickness for a given line speed v and chosen process parameters. In another preferred embodiment, the APCVD system 40 is located inside the tin bath 14 section. In a further preferred embodiment a multi deposition module holding APCVD system comprises at least one APCVD system 40T located in the tin bath 14 and at least one APCVD system 40L is located in the high temperature annealing lehr section 16. In one preferred embodiment of this invention, the motion control system 45 loops the deposition module from the deposition position 50 to the respective standby position 52, and then to the standby position 55 from where it moves next to the deposition position 50, and so forth.

FIG. 2b shows a cross sectional view of a preferred embodiment of this invention for a CVD system deposition having one or more substantially flat substrates 21 wherein the standby position 52 and the standby position 55 are located on the same side, i.e. to the right of the deposition position 50. The standby position 52 is preferably also a maintenance position since it allows easier access for deposition position module cleaning than the elevated standby position 55. The substrate 21 can for example be a continuous moving glass sheet 20 or a continuous flow of cut glass sheets, etc. FIG. 2b figuratively represents On-Line and Off-Line APCVD system cases, as well as other types of inline and batch type CVD surface coating systems. The two deposition modules 42 and 44 form a preferred minimum deposition module group per this invention, and, unless one or both of them are in a relocation mode, are either located in a deposition position 50 or in one of the two standby position positions 52 or 54/55.

In another preferred embodiment of this invention, when the time for deposition module maintenance comes for said first deposition module of each deposition module group, at least one other deposition module of the same deposition module group has already fully completed its maintenance cycle and is waiting at one of the two standby locations 52 or 54/55. If multiple deposition positions 50 are to be used in a given CVD system, then preferably all of them have such preferred deposition module groups and the deposition module exchange sequence can happen either sequentially for each deposition position 50 or in parallel for all used deposition positions 50 to reduce the overall CVD deposition process downtime. The speed of the deposition module exchange sequence shall preferably be as fast as possible without causing excessive thermal shocks to either a substrate 21 remaining inside the CVD deposition system and/or any other components of the CVD deposition system.

FIG. 2a shows the preferred embodiments of this invention, where the two offline standby positions 52 and 54 are on opposite sides of the process line. FIG. 2b on the other hand shows another preferred embodiment of this invention where both standby positions 52 and 55 are located on the same side of the process line, but are separated, for example, by height, i.e. one standby position is located substantially on top of the other one. In a different preferred embodiment of this invention, not shown in any images, the motion control system 45 comprises a rail system which splits into two sub-rails offside the enclosure 47 after a common center rail section leading from the deposition position 50 and with a respective sub-rail selection steering hardware and software system controlling the motion back and forth of the respective deposition modules 42 and 44 between two respective offsite location 52 and 55 and the respective deposition position 50.

In another preferred embodiment of this invention, as shown in FIG. 2b for the example of the APCVD system 40, to minimize thermal shock to any components contained by the enclosure 47 that encloses the deposition position 50 and/to the substrate 21, the removal/insertion process of the deposition modules from the enclosure 47 comprises at least a three step process. For example, in one preferred embodiment of this invention, the minimal three steps for a preferred deposition module removal process are: Step 1) elevate (shown in FIG. 2.b) or withdraw (not shown in FIG. 2b) the first deposition module from deposition position 50 through an access port 57 in the enclosure 47 so that its lower edge or opposite side edge is close or preferably slightly outside to the inner respective edge 49 of the enclosure 47 near the access port 57, i.e. relocate said first deposition module to a first extraction stop position 58; Step 2) place at least one heat shield 59 in front of the lower edge or opposite edge of the said first deposition module, i.e. in an access port thermal closure position to increase the thermal insulation between the inside and outside environment of the enclosure 47 near the access port 57; and Step 3) fully extract said first deposition module from said enclosure 49 through said access port 57 and relocated it to a free standby position. The preferred deposition module insertion process of this invention is basically the same process in reverse. Alternatively, the first stop location 58 can be slightly outside the enclosure and slightly outside the access port 57 and at least one heat shield 59 is inserted between the deposition module edge closes to the enclosure 49 and end flange of the access port 57 to thermally seal inner and outer environment of the enclosure 49 near the access port 57.

Note that a preferred heat shield can either be a passive or an active thermal element. For example, a passive heat shield is heat a shield made from ceramic wool, ceramic or other low conducting fiber board and other high efficiency, thermally compatible insulation material. For example, an active heat shield includes at least one electrically powered heating element or a flame heated surface area to provide an increased thermal barrier between the inside and outside of the enclosure 47 near the access port 57. Preferably an active heat shield is also a passive heat shield. An active heat shield typically allows for using a thinner heat shield than otherwise would be possible with a passive heat shield alone for a given thermal barrier design and is preferably used when the space on the inside of the enclosure 47 above the substrate surface or to the side of the substrate surface is very limited.

FIG. 2b shows the case where the first deposition module is first elevated a short distance to a first extraction stop position 58 chosen (shown as dashed outline of the deposition module) so that the bottom of the deposition module is slightly above the lower top level 49 of the enclosure 47. Next, a respectively sized heat shield 59 gets inserted from the left side the enclosure 47 and moved such that it covers the access port 57 in the enclosure 47. FIG. 2b shows this heat shield 59 both as not inserted and still located to the left of the enclosure 47 (solid outline) and also as fully inserted into the enclosure 47 from the left side and located slightly below (dashed outline) the lower top level 49 of the enclosure 47, thus insulating the inside from the outside of the enclosure 47 near the access port 57. Optional such a heat shield 59 can also be inserted from the same side as the standby locations 52 and 55. Another preferred heat shield insertion option (not shown in any picture) uses one or two hinged rotatable thermal heat shields 59 that, like window levers, upon an approximately 180 deg rotation around one or two hinges, rotate from next to the access port 57 and close to the top inner surface 49 of the enclosure 47 to underneath said first deposition module located at said first extraction stop position 58. i.e. to said access port thermal closure position.

A further preferred embodiment includes the lateral shifting of one or two heat shield as more fully detailed below and shown in FIGS. 3-6. FIG. 3 shows another preferred embodiment of this invention showing an enclosure 47 with four serial positions for deposition positions 50: two are filled with deposition modules 44, one with a heat shield 60 and one with no deposition position in the respective deposition position 50. The deposition modules 44 have an exhaust gas port 61. The empty deposition position 50 is shown with a closed left and right heat shield 62 and 64 that are located on top of the enclosure 47. Each deposition module 44 is shown, for example, with two service access ports 69 which allows easy cleaning of the inside of the deposition module 44, a quick connect system 73, and on the front and back of the deposition module 44 a support structure 72 mounts comprising one or more adjustable feet 74 which are either adjustable manually or automatically via a motorized system. These feet 74 are used to level the deposition module 44 with respect to the flat substrate 21 when the deposition module 44 is located at the respective deposition position 50. The quick connect system 73 enables to manually or automatically quickly connect or disconnect the deposition module 44 to a stationary process gas connection system 75 that is connected to process gas lines 77.

A motion control system 45 (not shown in FIG. 3) elevates the deposition module 42 or 44 and moves one or more heat shields 62 and 64 (see FIG. 3 and FIG. 6) in such a manner that the substrate 21 is exposed preferably for only a very short time (less than 60 seconds) to outside air through an AP 57 so as to prevent contamination of the substrate 21 and/or its breakage due to higher than normal temperature gradients across its body. In one preferred embodiment, a heat shield 60 is located at the deposition position 50 that is delivered and removed optimally with the same rail system 46 by replacing a respective deposition module 42 or 44 with a heat shield 60. This optional system feature, when incorporated on an On-Line APCVD system with deposition position located in the high temperature lehr 16 section, allows to operate a float glass line in a normal uncoated mode for extended periods of time, while the APCVD system is either shut down or being serviced (for example for a major component replacement or service problem, or when coated glass production is not desired for extended periods of times).

In one preferred embodiment of this invention, the deposition modules are connected/disconnected through a quick disconnect system 73 to a stationary gas connector 75 connected to the process gas distribution system lines 77 when the deposition modules 42 or 44 are moved from and to the deposition position 50. In another preferred embodiment, each deposition module 42 and 44 is connected permanently to a process gas distribution system via flexible hoses. For safety reason, the cooling fluid connection to the deposition module 42 and 44 is preferred to be semi-permanent connected. This minimizes the chance that a deposition module 42 or 44 can be overheated while it is being removed from or inserted to a deposition position 50 through an AP 57 in the enclosure 47 and allows decreasing the minimum time internal for safe deposition module exchange operation and therefore increases the overall CVD system productivity.

FIG. 5 shows another preferred embodiment of this invention, that helps to preserve overall floor space where the deposition module motion control system 45 includes a rail system 46 over the standby position 52 and 54 with a mezzanine support structure 103 where a portion of the system support hardware is located, for example as cooling systems 109, a gas distribution systems 111 and a motion and heating control systems 107.

Since with this invention higher servicing frequency rates of the deposition modules are no longer significantly affecting a given CVD system's productivity rate, and in addition higher process gas utilization and higher deposition rates can be achieved, an overall production cost reduction is now possible compared to equivalent prior art systems. Coating quality can be also improved, for example, just by more frequently exchanging the deposition modules while still maintaining or improving the production cost. The present invention makes such an abnormal CVD process parameter selection cost efficient and practical.

In one preferred embodiment, the rail system 46 is located overhead, and in another one, it is on the ground. In FIG. 5, when the deposition module 42, 44 is not moving, it is located either at the deposition position 50, i.e. inline with the substrate 21, or in a standby position 52, 54, which is located Off-Line to the right (left) of substrate, towards the end of travel of the rail system 46. When major servicing is needed a deposition module gets removed and replaced with another deposition module in one of the standby positions. Normally both deposition modules 42 and 44 are loaded on the rail system 46, but, if needed, only one of these two deposition modules can be installed and the other position can, for example, be empty. This arrangement allows that one of the deposition modules can be totally removed from the rail system 46 and replaced with a substitute deposition module or with a heat shield 60, as shown in FIG. 3, FIG. 5 and FIG. 6a-6f. As long as the replacement of the deposition module is completed before the other deposition module is due for servicing, the down time of the CVD system not affected, i.e. it is still just the deposition module exchange time. This invention therefore allows a much higher uptime and productivity for CVD systems, and in particular for coatings of glass sheets 20 when incorporated on a float glass line 10.

In one preferred embodiment of this invention, each deposition module 42 or 44 can travel to each standby position 52 or 54/55 by selecting an appropriate motion control service mode. This feature is beneficial for the installation/removal of a deposition module 42 or 44 and/or a heat shield 60 to/from the rail system 46 and provides more freedom to layout a respective factory or to work within the given access constraints of a pre-existing float glass factory.

The rail system 46 with respective motors, collision avoidance control logic and position sensors allows a quick exchange of a deposition module 42 or 44 between the deposition position 50 and one of the two standby position 52 or 54/55. In this manner the APCVD coating process on the float glass line 10 can quickly resume after a dirty deposition module has been replaced with a clean one and after the clean one has gone through a quick system temperature stabilization time period, together defining the deposition module exchange time. This is quite different from the prior art, shown in FIG. 1, where the APCVD coating can only be resumed after i) a deposition module 32 has been removed from the deposition position 36 and moved to the standby position 38, ii) is fully cooled down, iii) is fully serviced (for example cleaned), iv) is returned to the deposition position 36, and v) has gone through a respective warm up and system temperature stabilization phase. Therefore, the APCVD systems shown in FIGS. 2a and 2b, when compared to the prior art APCVD systems shown in FIG. 1, allows for a much shorter coating service down time. As long as the cool down and maintenance cycle of the offline parked deposition module is less than the usable deposition time of said first deposition module, the coating operation is nearly continuous with this invention. For example, if the deposition module exchange time is 30 min and if the usable deposition time between services is 12 h, the theoretical usable coating uptime for this invention is approximately 12 h/12.5 h=96%. This is significantly better than the prior art systems 30 that can operate only at less than the 12 h/20.5 h=64% theoretical usable coating time for a 30 min startup time and for an 8 h cool down and service time for the removed deposition module 32.

A detailed view of a cut-out section of the FIG. 3 is shown in FIG. 4. The bearings 84 mounted on a support frame 86 hold the rollers 82 which are driven in a synchronized manner by a common drive system (not shown in FIG. 4). The feet 74 rest on a support bar 88 whose height optionally is adjustable by an adjustment bar 90 that is either adjusted manually or automatically with a motorized system. The height of the adjustment bar 90 can, for example, be adjusted to compensate for the thickness variations of different glass sheets 10 so that the distance between the deposition roof of the deposition module 42 or 44 is at the optimum height separation from the top surface of a flat substrate surface 21 for a given line speed v and process parameters selection.

FIG. 4 illustrates another preferred embodiment of this invention where the support structure 80 has one or more optional heaters 79a installed underneath the substrate 21 that have electrical outside connections 79 that allow to energize individual heating zones. Preferably the APCVD coating system includes a multi channel temperature control system and the heaters 76 and/or heaters 79a include respective localized temperature sensors (for example thermocouples or optical pyrometers) that allows to spatially non-uniformly increase the temperature of the substrate 21 in the X-axis direction, so that the net result is a hotter substrate 21 that has optimally a narrower temperature variation along the X-axis.

This provides the ability to reheat and/or to further heat the substrate 21 while underneath the deposition module 42 or 44 and/or to compensate for temperature losses at the sides of the substrate in order to keep the substrate at a more uniform process temperature. A thermal insulating system is located below the heating elements with electrical outside connections 79 and below the rollers 82 to minimize heat loss. In one preferred embodiment of this invention the lower or upper heaters 79a or 76 contains multi-zone heating elements that can be removed (with appropriate tooling) at least from one side of the frame 80 for replacement while the enclosure 47 is at normal elevated process temperatures. The underneath heaters 79a also allow compensating for substrate temperature losses occurring while moving underneath the deposition module. The cooling of the substrate 21 by a deposition module in full operation can be in the range of 10-50° C. Therefore, the underneath heaters 79a are ideally capable of at least compensating for some of these deposition related heat losses and/or to further elevate the substrate temperature, as needed, to reach the next deposition module at the optimum substrate surface temperature.

The heaters 76 that are located underneath the heat shields 62 and 64 and between individual deposition module's and that are energized through the outside electrical connections 78, further provide spatially resolved thermal heating options to provide additional heating of the substrate 21 while it is traveling between two deposition module's located in series. Together both heating systems allow a greater thermal control and process adjustability. In addition, since the line speed v is typically adjusted for different substrate 21 thicknesses, these underneath and/or above heaters allow more process freedom for tuning an individual APCVD systems 40 for different line speeds v so that they work together in series to produce a targeted multi layer thin film deposition.

A perspective view of an embodiment of this invention for a CVD system 40L is shown in FIG. 5. The support structure 101 supports the four overhanging rail systems 46 which move four deposition module pairs 42 and 44 connected through connection joints 71 to extendable support arms 70 between the standby position 52 or 54 and the deposition position 50. On top of the support structure 101 is a mezzanine floor structure 103 located over the standby position 52 and standby position 54 which can be reached, for example, by one or more ladders 105. In order to save factory floor space, in one of the preferred embodiments of this invention, some of the CVD systems peripheral system hardware can be located on this mezzanine floor 103. For example, it can hold the motorized control system 107 for the left and right section of the rail system 46L, a primary and backup oil-cooling systems 109 for the deposition modules 42 and 44L and a portion of the process gas delivery systems 111 that uses liquid precursors that need to be vaporized. The main on-side CVD system operator control unit 113 is located preferably on the ground floor to increase overall system safety.

The heat shield 60 is shown with a mounting bracket 121 that optionally stays with the heat shield 60 when it is disconnected from the support arms 70 of the respective rail system 46. The extendable support arms 70, which incorporate a vertical motion system also typically incorporate some of the permanent flexible cooling fluid lines as well as some of the electrical control, sending and/or power lines for each respective deposition module. In one preferred embodiment of this invention, the deposition modules 42 and 44 are dual side mounted onto two support arms 70 to decrease the unsupported length distance the deposition modules 42 and 44, so that the weight and stiffness of the deposition modules 42 and 44 can be reduced compared to one side mounted deposition modules like the prior art deposition modules 32 which are often placed in the tin bath 14. Together with the one sided mounting of the prior art rail system 34T, such prior art deposition modules 32T require more mechanical stiffness and therefore more mass resulting in increased weight, cooling cost and service cycle time. This is important especially for a APCVD system incorporated into a float glass line 10, where the width of the float glass sheet 20 can be 3-4 m wide and the process temperatures between 500 to 700° C. and the selection of materials able to handle the process environment for extended period of times are limited.

Optionally, some of the power connections of the deposition modules 42 or 44 or of the heat shields 60 are done near the deposition position 50 to simplify the overall wiring of the APCVD system 40. The deposition modules 42 and 44 are being connected to the exhaust tubing 125 through the exhaust connection tubes 127 which, for example, rotates from 90° to 180° and can be elevated and lowered by a motorized motion mechanism located below the speed controlled exhaust blower unit 129 that regulates the exhaust gas flow level from a respective deposition module 42 or 44. The motion of these exhaust connection tubes 127 is done in such a manner that they connect or disconnect to the exhaust port 61 of the deposition module 42 and 44 and that they move and rotate out of the way during the exchange phase of the deposition modules 42 and 44 between the deposition position 50 and the standby positions 52 or 54.

One of the preferred embodiments of this invention is depicted in the figure series FIGS. 6a-6f, where a heat shield 60 is exchanged via an automated process with a deposition module 44 in the deposition position 50. A similar procedure is preferred for the exchange of two deposition modules 42 and 44 in the deposition position 50. FIG. 6a shows that in the first step the replacement deposition module 44 is moved close to the deposition position 50. Next the heat shield 60 is elevated just slightly above the respective heat shield's 62 and 64 (FIG. 6b). After that the respective heat shield's 62 and 64 are closed quickly (FIG. 6c).

FIG. 6d shows then the option where the heat shield 60 is moved to the side and over the 76 and parted outside the enclosure 47. This provides the option of using the space over the heaters 76 as a storage space for the heat shield 60 until it is needed again, as indicated in FIGS. 6a-6f. Alternatively, the heat shield 60 can also be removed from the deposition position 50 by connecting it first to the support posts 70 via the connections 71 which are then doing the lifting (FIG. 6b) followed by closing the respective heat shields 62 and 64 and moving the heat shield 60 to the standby position 52.

In the next step the deposition module 44 is moved into the deposition position 50 (FIG. 6e) where it hovers just barely above the closed respective heat shield 62 and 64. Next the respective heat shields 62 and 64 are opened and the deposition module 44 is quickly lowered down until its support feet 74 rest on the support bar 88 as shown in more detail in FIG. 4.

Optionally (not shown in FIG. 6b) the front and side section of the process line also have suitable heat shield's that move up or down when the heat shield or deposition module moves up or down so as to minimize any exposure of the substrate 21 with the outside environment.

Therefore this invention facilitates the modification of a portion of a preexisting high temperature annealing lehr 16 to make it adaptable for a CVD coating process that can be turned on and off on demand with respective system reconfigurations. The heat shield 60 is optionally used when the APCVD system 40 is not needed or is down for longer periods of time, and it replaces a section of the removed high temperature annealing lehr 16 in such a manner that the glass sheet 20 (substrate 21) cools down in a normal manner when the deposition modules 42 or 44 is not being used. Optionally, the heaters 76 located between the various deposition positions 50 and/or the heaters located underneath the substrate 21 can also be used to control the temperature gradient across (X-axis) and along (Z-axis) said substrate 21.

In the above described manner, and as modified to handle a quick deposition module exchange for each deposition position 50, the present invention improves the uptime of a given APCVD system 40 incorporated into a float glass line 10 significantly. In a similar manner, an APCVD system 40T can obtain an improved uptime as well, however there are no heat shields 62 and 64 and no additional heaters 76 underneath float glass sheet 20 since the tin bath 14 and the respective overhanging tin bath heaters are the only heaters needed in this environment. Respective doors and gas isolation systems to the sides of the tin bath 14 and need to be used to prevent or at least to minimize the exposure of the interior of the tin bath 14 to the outside oxygen rich environment since it will oxidize the hot tin in the tin bath and therefore require additional Hydrogen treatment to reduce the oxidized tin oxide back to tin, all of which cost time and energy and wastes more materials.

Various multi-layer thin film APCVD coatings can be obtained on float glass sheets 20 or other substantially flat substrates at high speed with the present invention. The present invention in not intended to be limited to one or another type of CVD coating or to an On-Line or Off-Line system. Those skilled in the art can adapt the teachings of this invention to other similar CVD thin film deposition process applications, all of which are herewith intended to be included herewith.

What is claimed:

1. A method of increasing uptime of an atmospheric pressure chemical vapor deposition glass coating line, comprising:
    providing an atmospheric pressure chemical vapor deposition system for coating at least one moving glass substrate, said system defining at least one first and one second deposition position spaced apart from each other and located substantially in line with said moving glass substrate, the system including:
        at least a first and a second deposition module including respectively at least a first and a second deposition module, said deposition module groups defining respectively at least a first and a second standby position, each of said standby positions being located substantially offline from said moving glass substrate, said first deposition module of said first and second group is being located at said first and said second deposition position and said second deposition module of said first and second group is being located most of the time at one of said respective standby positions, and where each of said deposition modules is able to deposit a thin film coating over at least a substantial portion of the width of said glass substrate;

a motion control system in communication with said deposition modules to effect a deposition module exchange sequence whereby said first deposition module is relocated from said deposition position to the other of said standby position and said second deposition module is relocated from one of said standby positions to said deposition position;

operating said glass substrate coating line until said first deposition module requires cleaning; and operating said motion control system to relocate said first deposition module away from said deposition position and to relocate said second deposition module from one of said standby positions to said deposition position.

2. The method according to claim 1, further comprising:
temporarily stopping the thin film deposition of said glass coating line prior to said deposition module exchange; and
restarting the thin film deposition following said deposition module exchange.

3. The method according to claim 2, further comprising servicing said first deposition module.

4. The method according to claim 2, wherein said deposition module exchange sequence is accomplished in less than 60 minutes.

5. The method according to claim 4, wherein said deposition module exchange sequence is accomplished in less than 30 minutes.

6. The method according to claim 2, further comprising:
relocating said first deposition module to a first stop position;
providing at least one heat shield;
positioning said heat shield near said moving glass substrate to protect said substrate from contamination and temperature gradients; and
moving said first deposition module from said first stop position to at least one of the standby positions.

7. The method according to claim 6, further comprising:
providing an enclosure for surrounding said deposition position, said enclosure having an access port; and
removing said deposition module from said enclosure through said access port followed by said heat shield positioning step.

8. The method according to claim 7, further comprising:
elevating said first deposition module from said deposition position to a first stop position;
positioning said heat shield near said moving glass substrate and between said deposition module;
relocating said first deposition module from said first stop position to at least one of the standby positions;
relocating said second deposition module to said first stop position;
removing said heat shield from between said moving glass substrate and said second deposition module; and
lowering said second deposition module from said first stop position to said deposition position.

9. The method according to claim 7, further comprising:
translating said first deposition module from said deposition position to a first stop position;
positioning said heat shield near said moving glass substrate and between said deposition module;
relocating said first deposition module from said first stop position to at least one of the standby positions;
relocating said second deposition module to said first stop position;
removing said heat shield; and
translating said second deposition module from said first stop position to said deposition position.

* * * * *

UNITED STATES PATENT AND TRADEMARK OFFICE
CERTIFICATE OF CORRECTION

PATENT NO.         : 8,460,752 B2                                                                Page 1 of 1
APPLICATION NO.    : 12/559961
DATED              : June 11, 2013
INVENTOR(S)        : Rosenbaum et al.

It is certified that error appears in the above-identified patent and that said Letters Patent is hereby corrected as shown below:

IN THE CLAIMS:

Column 12, line 65

Claim 1    now reads "deposition module including"

should read -- deposition module group including --

Signed and Sealed this
Fifteenth Day of July, 2014

Michelle K. Lee
*Deputy Director of the United States Patent and Trademark Office*